US012813195B2

(12) United States Patent
Navarro et al.

(10) Patent No.: US 12,813,195 B2
(45) Date of Patent: Nov. 24, 2026

(54) SHOWER NOZZLE CONFIGURATION FOR SEMICONDUCTOR WAFER DICING SAW SYSTEM

(71) Applicant: Littelfuse, Inc., Chicago, IL (US)

(72) Inventors: Sweetheart Meryl Navarro, Lipa (PH); Jellamae Angeles, Lipa (PH); Teodoro Burgos, Lipa (PH)

(73) Assignee: Littelfuse, Inc., Rosemont, IL (US)

( * ) Notice: Subject to any disclaimer, the term of this patent is extended or adjusted under 35 U.S.C. 154(b) by 343 days.

(21) Appl. No.: 18/602,992

(22) Filed: Mar. 12, 2024

(65) Prior Publication Data

US 2025/0293056 A1 Sep. 18, 2025

(51) Int. Cl.
*H10P 72/00* (2026.01)

(52) U.S. Cl.
CPC ...... *H10P 72/0428* (2026.01); *H10P 72/0414* (2026.01)

(58) Field of Classification Search
CPC ............ H10P 72/0428; H10P 72/0414; B28D 5/0058; B28D 5/022; B28D 5/0076
See application file for complete search history.

(56) References Cited

U.S. PATENT DOCUMENTS

| | | | | |
|---|---|---|---|---|
| 6,105,567 | A * | 8/2000 | Sun | B28D 5/0076 451/450 |
| 6,467,278 | B1 * | 10/2002 | Hu | B28D 5/0076 83/171 |
| 7,572,168 | B1 * | 8/2009 | Phaowongsa | B28D 5/022 451/7 |
| 2010/0009517 | A1 * | 1/2010 | Collier | H10P 70/30 252/79.1 |

* cited by examiner

*Primary Examiner* — Tucker J Wright
(74) *Attorney, Agent, or Firm* — KDW Firm PLLC

(57) ABSTRACT

A semiconductor dicing saw system including a semiconductor dicing saw having a cutting blade, a chuck table located below the semiconductor dicing saw for supporting a semiconductor substrate to be cut by the semiconductor dicing saw, and a shower head located adjacent the semiconductor dicing saw, the shower head including a first nozzle positioned and oriented to direct a first stream of fluid at the cutting blade, and a second nozzle positioned and oriented to direct a second stream of fluid at a juncture of the cutting blade and a semiconductor substrate being cut by the cutting blade.

14 Claims, 1 Drawing Sheet

*(A-A from Fig. 1)*

SHOWER NOZZLE CONFIGURATION FOR SEMICONDUCTOR WAFER DICING SAW SYSTEM

FIELD OF THE DISCLOSURE

The present disclosure relates generally to the field of semiconductor device fabrication and relates more particularly to a nozzle configuration of a semiconductor wafer saw shower.

FIELD OF THE DISCLOSURE

Semiconductor substrates are typically made of brittle materials such as silicon or gallium arsenide. These materials can be prone to chipping or fracturing under mechanical stress. For example, chipping can occur during a sawing process, wherein a diamond-tipped saw blade is used to cut through a semiconductor wafer along predefined lines to singulate individual semiconductor dies. This process subjects the wafer to mechanical stress, which can sometimes cause small fragments to chip off from the sawn edges of the wafer, resulting in scrappage/waste. Chipping can also be detrimental to the performance of a semiconductor die and can predispose a semiconductor die to cracking. Chipping can be mitigated during the wafer sawing process by carefully controlling process parameters such as blade speed and feed rate, but such controls can reduce throughput and dimmish die yield.

In view of the above, it would be advantageous to provide a system and a method for mitigating semiconductor wafer chipping during a wafer sawing process while also achieving high throughput and yield.

It is with respect to these and other considerations that the present improvements may be useful.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

A semiconductor dicing saw system according to an embodiment of the present disclosure may include a semiconductor dicing saw having a cutting blade, a chuck table located below the semiconductor dicing saw for supporting a semiconductor substrate to be cut by the semiconductor dicing saw, and a shower head located adjacent the semiconductor dicing saw, the shower head including a first nozzle positioned and oriented to direct a first stream of fluid at the cutting blade, and a second nozzle positioned and oriented to direct a second stream of fluid at a juncture of the cutting blade and a semiconductor substrate being cut by the cutting blade.

A shower head for a semiconductor dicing saw system according to an embodiment of the present disclosure may include a first nozzle positioned and oriented to direct a first stream in a first direction, and a second nozzle positioned and oriented to direct a second stream of fluid in a second direction different from the first direction.

Figure 1:
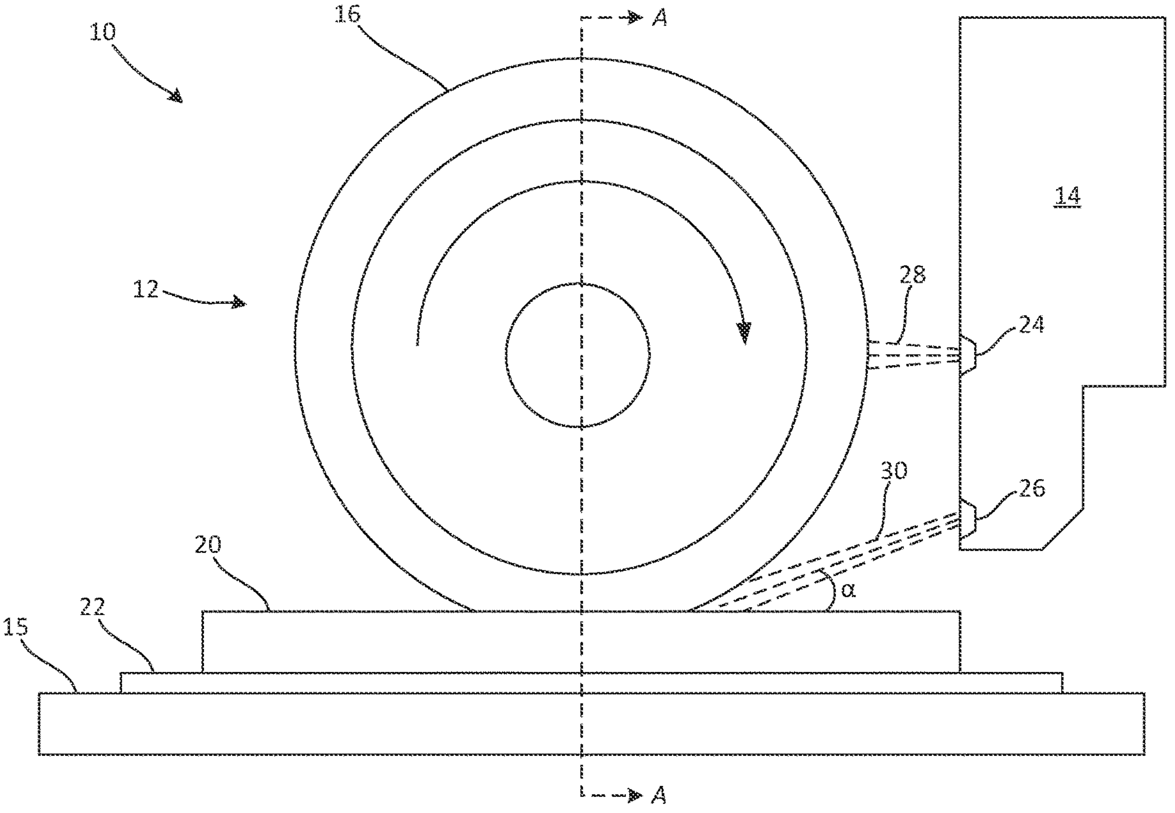
FIG. 1 is a schematic side view illustrating a semiconductor dicing saw system in accordance with an embodiment of the present disclosure.

The drawings are not necessarily to scale. The drawings are merely representations, not intended to portray specific parameters of the disclosure. The drawings are intended to depict example embodiments of the disclosure, and thus are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

A semiconductor dicing saw system and accompanying method in accordance with the present disclosure will now be described more fully hereinafter with reference to the accompanying drawings, in which certain exemplary embodiments of the fuse are presented. The system and method may be embodied in many different forms and is not to be construed as being limited to the embodiments set forth herein. These embodiments are provided so that this disclosure will be thorough and complete, and will fully convey the scope of the system and method to those skilled in the art. In the drawings, like numbers refer to like elements throughout unless otherwise noted.

Figure 2:
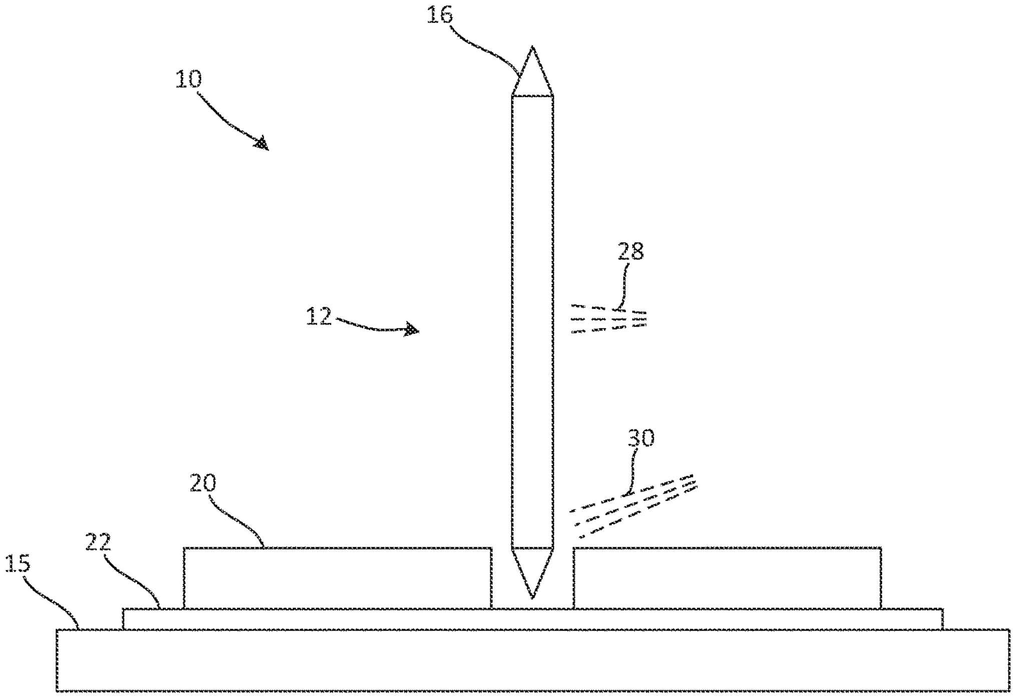
FIG. 2 is a schematic cross-sectional view of the semiconductor dicing saw system of FIG. 1 taken along plane A-A shown in FIG. 1.

Referring to FIGS. 1 and 2, a side view and a cross sectional view illustrating a semiconductor dicing saw system 10 (hereinafter "the system 10") in accordance with an exemplary embodiment of the present disclosure are provided, respectively. For the sake of convenience and clarity, terms such as "top," "bottom," "up," "down," "upper," "lower," "above," "below," "vertical," and "horizontal," may be used herein to describe the relative positions and orientations of various components of the system 10, all with respect to the geometry and orientation of the system 10 as it appears in FIGS. 1 and 2. Said terminology will include the words specifically mentioned, derivatives thereof, and words of similar import.

The system 10 may generally include a semiconductor dicing saw 12 (hereinafter "the dicing saw 12"), a shower head 14 located adjacent the dicing saw 12 (the shower head 14 is omitted from FIG. 2 for clarity), and a chuck table 15 located below the dicing saw 12. In various embodiments, the dicing saw 12 and the shower head 14 may be mounted to a common frame or housing (not shown) in a conventional configuration as known in the art. The dicing saw 12 may be any known type of dicing saw, and may, for example, employ a cutting blade 16 formed of metal, ceramic, carbide, diamond, or a combination thereof, according to non-limiting embodiments of the present disclosure. The cutting blade 16 may be mounted on a spindle (omitted for clarity) in a conventional manner. The dicing saw 12 may be adapted to cut a trench 18 into a semiconductor substrate 20 disposed on the chuck table 15, wherein a vertical position of the dicing saw 12 can be adjusted to achieve a trench 18 with a controllable and fixed depth. For example, as shown in FIGS. 1 and 2, the dicing saw 12 may be operated to cut entirely through the semiconductor substrate 20 to singulate individual semiconductor dies therefrom. In various embodiments, the semiconductor substrate 20 may be mounted on an adhesive sheet or backing 22 to prevent unwanted movement or shifting of the separated portions of the semiconductor substrate 20 after cutting. The present disclosure is not limited in this regard.

The shower head 14 may be located in front of the dicing saw 12 (where the term "front" is defined herein to mean the right side of the page in FIG. 1) such that a top of the cutting blade 16 rotates toward the shower head 14. The present disclosure is not limited in this regard. The shower head 14 may be spaced a short distance away from the cutting blade 16, e.g., 0.5 inches to 2 inches away from a forwardmost extent of the cutting blade 16. In various embodiments, a vertical position of the shower head 14 may be adjustable (e.g., via manual adjustment, or via mounting on a track/rail along which positional adjustment of the shower head 14 may be driven by a servo motor or the like). The shower head 14 may include a first nozzle 24 and a second nozzle 26 disposed in a confronting relationship with the front of the cutting blade 16. The first nozzle 24 may be positioned and oriented to direct a first stream of fluid 28 at the front edge of the cutting blade 16. The first stream of fluid 28 is shown in FIG. 2 as being directed at a side of the cutting blade 16, but this view is provided to indicate the vertical position of the first stream of fluid 28 only, and the first stream of fluid 28 is in-fact directed at a front edge of the cutting blade 16 in a direction parallel to the cutting blade 16 as shown in FIG. 1. In various embodiments, a vertical position of the first nozzle 24 may be equal to or near a vertical position of a central axis of the cutting blade 16, such that the first nozzle 24 and the axis of the cutting blade 16 are coplanar (or nearly coplanar) on a horizontal plane that is parallel to a top surface of the chuck table 15. Positioned thusly, the first nozzle 24 may direct the first stream of fluid 28 at the cutting blade 16 generally horizontally, or in a direction generally parallel to the top surface of the chuck table 15. The present disclosure is not limited in this regard. The first stream of fluid 28 may be a fluid selected to cool and/or lubricate the cutting blade 16. In a non-limiting example, the fluid may be deionized water mixed with a surfactant.

The second nozzle 26 may be located below the first nozzle 24 and may be positioned and oriented to direct a second stream of fluid 30 at a bottom of the front edge of the cutting blade 16 (i.e., a portion of the front edge of the cutting blade 16 nearest the chuck table 15). The second nozzle 26 may be located a distance in a range of 0.50 inches to 2 inches above the top surface of the chuck table 15. The present disclosure is not limited in this regard. The second stream of fluid 30 is shown in FIG. 2 as being directed at a side of the cutting blade 16, but this view is provided to indicate the vertical position of the second stream of fluid 30 only, and the second stream of fluid 30 is in-fact directed at a front edge of the cutting blade 16 in a direction parallel to the cutting blade 16 as shown in FIG. 1. During operation of the dicing saw 12, and as shown in FIGS. 1 and 2, the second nozzle 26 may direct the second stream of fluid 30 at a juncture of the front edge of the cutting blade 16 and the semiconductor substrate 20 being cut (and specifically at the portion of the semiconductor substrate 20 being engaged/cut by the cutting blade 16). In various embodiments, a mean angle $\alpha$ of the second stream of fluid 30 relative to a top surface of the semiconductor substrate 20 (or relative to a top surface of the chuck table 15, or relative to the direction of the first stream of fluid 28) may be in a range of 20 degrees to 45 degrees. The present disclosure is not limited in this regard. The second stream of fluid 30 may be a fluid selected to cool, lubricate, and/or clear debris from the cutting blade 16 and the semiconductor substrate 20 being cut. In various embodiments, the second stream of fluid 30 may be the same fluid as the first stream of fluid 28 (e.g., deionized water mixed with a surfactant) or may be a different fluid. The present disclosure is not limited in this regard.

The system 10 is shown in FIGS. 1 and 2 as having a single cutting blade 16 adapted to rotate in a clockwise direction (as oriented in FIG. 1) and a single shower head 14 located in front of the cutting blade 16 (i.e., on the right side of the system as oriented in FIG. 1). In various alterative embodiments of the present disclosure, the system 10 may further include a second cutting blade located adjacent, and oriented parallel to, the first cutting blade 16 and adapted to rotate in a counterclockwise direction, and a second shower head identical to the first shower head 14 located at rear of the system 10 (i.e., on the left side of the system 10 as oriented in FIG. 1) and configured to project streams of fluid at edge of the second cutting blade. The present disclosure is not limited in this regard.

Those of skill in the art will appreciate the advantages provided by the above-described system 10, and particularly the shower head 14. Specifically, the shower head 14 includes a first nozzle 24 adapted to facilitate cooling and lubrication of the cutting blade 16 (as in convention dicing saw systems), and also includes a second nozzle 26 adapted to facilitate cooling and lubrication at the juncture of the cutting blade 16 and a semiconductor substrate 20 being cut. By directly applying the second stream of fluid 30 to the portion of the semiconductor substrate 20 being cut, friction at the interface of the cutting blade 16 and the semiconductor substrate 20 can be significantly reduced, thereby mitigating chipping of the semiconductor substrate 20. The quality of semiconductor dies cut by the system 10 is thereby improved and waste/scrappage is reduced relative to conventional systems.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A semiconductor dicing saw system comprising:
- a semiconductor dicing saw having a cutting blade;
- a chuck table located below the semiconductor dicing saw for supporting a semiconductor substrate to be cut by the semiconductor dicing saw; and
- a shower head located adjacent the semiconductor dicing saw, the shower head comprising:
  - a first nozzle positioned and oriented to direct a first stream of fluid at the cutting blade; and
  - a second nozzle positioned and oriented to direct a second stream of fluid at a juncture of the cutting blade and a semiconductor substrate being cut by the cutting blade, wherein the first nozzle and the second nozzle are disposed in a confronting relationship with a front edge of the cutting blade, and wherein the second nozzle is located below the first nozzle;

wherein the first nozzle is coplanar with an axis of the cutting blade on a plane that is parallel to a top surface of the chuck table.

2. The semiconductor dicing saw system of claim 1, wherein the second nozzle is positioned and oriented to direct the second stream of fluid at a mean angle in a range of 30 degrees to 45 degrees relative to a top surface of the chuck table.

3. The semiconductor dicing saw system of claim 1, wherein the first nozzle is positioned and oriented to direct the first stream of fluid in a first direction, and wherein the second nozzle is positioned and oriented to direct the second stream of fluid at a mean angle in a range of 20 degrees to 45 degrees relative to the first direction.

4. The semiconductor dicing saw system of claim 1, wherein a top of the cutting blade rotates toward the shower head.

5. The semiconductor dicing saw system of claim 1, wherein the shower head is spaced away from an edge of the cutting blade a distance in a range of 0.5 inches to 2 inches.

6. The semiconductor dicing saw system of claim 1, wherein the second nozzle is located a distance in a range of 0.5 inches to 2 inches above a top surface of the chuck table.

7. The semiconductor dicing saw system of claim 1, wherein the first stream of fluid is deionized water mixed with a surfactant.

8. The semiconductor dicing saw system of claim 1, wherein the second stream of fluid is deionized water mixed with a surfactant.

9. The semiconductor dicing saw system of claim 1, wherein a vertical position of the shower head is adjustable.

10. A shower head for a semiconductor dicing saw system, the shower head comprising:

a first nozzle positioned and oriented to direct a first stream in a first direction, wherein the first nozzle is configured to be coplanar with an axis of a cutting blade on a plane that is parallel to a top surface of a chuck table of the semiconductor dicing saw system; and a second nozzle positioned and oriented to direct a second stream of fluid in a second direction different from the first direction, wherein the first nozzle and the second nozzle are configured to be disposed in a confronting relationship with a front edge of the cutting blade of the semiconductor dicing saw system, and wherein the second nozzle is located below the first nozzle.

11. The shower head of claim 10, wherein the second nozzle is positioned and oriented to direct the second stream of fluid at a mean angle in a range of 20 degrees to 45 degrees relative to the first direction.

12. The shower head of claim 10, wherein the first stream of fluid is deionized water mixed with a surfactant.

13. The shower head of claim 10, wherein the second stream of fluid is deionized water mixed with a surfactant.

14. The shower head of claim 10, wherein a vertical position of the shower head is adjustable.

* * * * *